(12) United States Patent
Asano et al.

(10) Patent No.: US 9,941,686 B2
(45) Date of Patent: Apr. 10, 2018

(54) SENSOR DEVICE

(71) Applicant: Hitachi Automotive Systems, Ltd., Hitachinaka-shi, Ibaraki (JP)

(72) Inventors: Satoshi Asano, Tokyo (JP); Masahiro Matsumoto, Tokyo (JP); Hiroshi Nakano, Tokyo (JP); Shinobu Tashiro, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 81 days.

(21) Appl. No.: 15/029,639

(22) PCT Filed: Oct. 3, 2014

(86) PCT No.: PCT/JP2014/076487
§ 371 (c)(1),
(2) Date: Apr. 15, 2016

(87) PCT Pub. No.: WO2015/060095
PCT Pub. Date: Apr. 30, 2015

(65) Prior Publication Data
US 2016/0241014 A1 Aug. 18, 2016

(30) Foreign Application Priority Data

Oct. 23, 2013 (JP) .................................. 2013-219737

(51) Int. Cl.
*G01R 33/02* (2006.01)
*H02H 3/18* (2006.01)
(Continued)

(52) U.S. Cl.
CPC ............. *H02H 3/18* (2013.01); *G01R 15/146* (2013.01); *H01L 27/0248* (2013.01);
(Continued)

(58) Field of Classification Search
CPC .... G01R 33/04; G01R 33/075; G01R 33/077; G01R 35/005; G01R 33/022;
(Continued)

(56) References Cited

U.S. PATENT DOCUMENTS 3,022,457 A * 2/1962 Doan ........................ G05F 3/18
323/311
4,480,226 A * 10/1984 Kuno ...................... G01C 17/30
324/247

(Continued)

FOREIGN PATENT DOCUMENTS

JP 10-285930 A 10/1998
JP 10-336905 A 12/1998
(Continued)

OTHER PUBLICATIONS

European Search Report issued in counterpart European Application No. 14856600.3 dated May 11, 2017 (nine pages).

(Continued)

*Primary Examiner* — Patrick Assouad
*Assistant Examiner* — Taqi Nasir
(74) *Attorney, Agent, or Firm* — Crowell & Moring LLP

(57) ABSTRACT

Provided is a sensor device that suppresses a malfunction caused by a negative surge or a voltage drop. A sensor device includes a sensor element having an electrical characteristic varying according to a physical amount, a signal processing circuit configured to process an output signal of the sensor element, a transistor element interposed between a power source terminal and the signal processing circuit, a resistive element configured to connect a drain and a gate of the transistor element, or a collector and a base of the transistor element, and an element having threshold voltage for connecting the gate or the base of the transistor element to a GND. The element regulates current flowing from the resis- (Continued)

tive element in a direction of the GND, in a case in which supply voltage to the signal processing circuit falls below the threshold voltage.

14 Claims, 3 Drawing Sheets

(51) Int. Cl.
*G01R 15/14* (2006.01)
*H01L 27/02* (2006.01)
*H01L 27/06* (2006.01)
*H01L 49/02* (2006.01)
*H01L 29/861* (2006.01)
*H02H 11/00* (2006.01)
*H02H 3/24* (2006.01)

(52) U.S. Cl.
CPC ...... *H01L 27/0629* (2013.01); *H01L 27/0647* (2013.01); *H01L 28/20* (2013.01); *H01L 28/40* (2013.01); *H01L 29/861* (2013.01); *H02H 11/002* (2013.01); *H02H 3/24* (2013.01)

(58) Field of Classification Search
CPC .. G01R 33/028; G01R 33/032; G01R 33/063; G01R 33/10; G01R 33/1276; G01R 15/202; G01R 17/105
USPC ... 324/326–329, 750.12, 331, 228–263, 529, 324/754.29, 179, 207.25
See application file for complete search history.

(56) References Cited

U.S. PATENT DOCUMENTS

| | | | | |
|---|---|---|---|---|
| 5,422,570 A | * | 6/1995 | Moreira | G01P 3/48 318/400.41 |
| 5,537,038 A | * | 7/1996 | Ando | G01N 27/82 324/234 |
| 7,659,716 B2 | * | 2/2010 | Nishikawa | G01D 5/142 324/244 |
| 2003/0048653 A1 | * | 3/2003 | Watanabe | G06K 19/0701 363/127 |
| 2004/0119470 A1 | * | 6/2004 | Yajima | G01V 3/105 324/253 |
| 2006/0001567 A1 | * | 1/2006 | Nilsson | G01F 23/284 342/124 |
| 2008/0298784 A1 | * | 12/2008 | Kastner | G01P 3/44 388/811 |
| 2013/0138374 A1 | * | 5/2013 | Komatsu | G01R 33/0023 702/65 |

FOREIGN PATENT DOCUMENTS

| | | |
|---|---|---|
| JP | 2000-341848 A | 12/2000 |
| JP | 2003-37933 A | 2/2003 |
| JP | 2013-21883 A | 1/2013 |

OTHER PUBLICATIONS

International Search Report (PCT/ISA/210) issued in PCT Application No. PCT/JP2014/076487 dated Dec. 22, 2014 with English translation (5 pages).
Japanese-language Written Opinion (PCT/ISA/237) issued in PCT Application No. PCT/JP2014/076487 dated Dec. 22, 2014 (4 pages).

* cited by examiner

SENSOR DEVICE

TECHNICAL FIELD

The present invention relates to a sensor device supplied with power from the outside, and particularly to a sensor device having breakdown resistance and malfunction resistance to a negative surge that occurs in a power line.

BACKGROUND ART

If a negative surge or a voltage fluctuation occurs in a power line, supply voltage to a load circuit becomes negative voltage, and reverse current flows in the load circuit, so that breakdown may occur. As a conventional technique addressing such an issue, there is a technique described in PTL 1.

The technique described in PTL 1 is configured to divide supply voltage to a P-type FET provided between a power source and a load circuit, and to the load circuit, via a resistor, and to input intermediate voltage thereof to a gate of the P-type FET. The load circuit is protected in the following manner. When an input-side polarity is normally connected, the P-type FET enters an ON state to supply source voltage to the load circuit, and when the input-side polarity is reversely connected, the P-type FET enters an OFF state so that reverse polarity voltage is not applied to the load circuit.

CITATION LIST

Patent Literature

PTL 1: JP-2000-341848-A

SUMMARY OF INVENTION

Technical Problem

In recent years, however, there has been an increasing demand for cost reduction, and it is necessary to simplify a protection circuit provided on the outside of a conductor chip. In this case, a negative surge or a voltage drop that continues for a relatively longer time than that in conventional circuits occurs in a power line. If load circuit side voltage falls below threshold voltage of the P-type FET, the P-type FET turns OFF. As a result, electrical charge accumulated in the load circuit stops being discharged to a power source side via the P-type FET. Nevertheless, if the negative surge continues even after this state, electrical charge accumulated in the load circuit via voltage division resistors continues to be discharged. Finally, the accumulated electrical charge is fully discharged. In response to the full discharge, the load circuit is reset. Thus, a malfunction such as an abnormal value output and a restarting operation may occur.

The present invention has been devised in view of the above-described situations, and the object of the present invention is to provide a sensor device that has high malfunction resistance, and suppresses a voltage drop in a load circuit even if a negative surge or a voltage drop that continues for a relatively long time occurs in a power line.

Solution to Problem

To achieve the above-described object, a sensor device according to the present invention includes a sensor element having an electrical characteristic varying according to a physical amount, a signal processing circuit configured to process an output signal of the sensor element, a transistor element interposed between a power source terminal and the signal processing circuit, a resistive element configured to connect a drain and a gate of the transistor element, or a collector and a base of the transistor element, and an element having threshold voltage for connecting the gate or the base of the transistor element to a GND. The element regulates current flowing from the resistive element in a direction of the GND, in a case in which supply voltage to the signal processing circuit falls below the threshold voltage.

Advantageous Effects of Invention

The present invention can provide a sensor device that has high malfunction resistance, and can suppress a voltage drop in a load circuit even if a negative surge or a voltage drop that continues for a relatively long time occurs in a power line.

DESCRIPTION OF EMBODIMENTS

Embodiments of the present invention will be described below with reference to the drawings.

Figure 1:
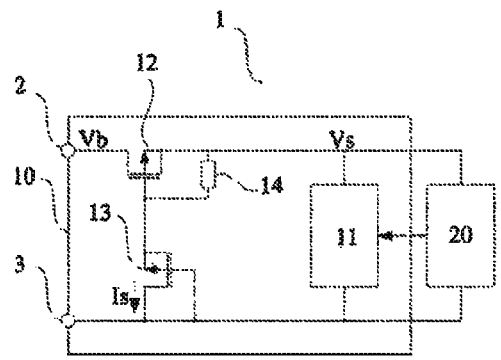
FIG. 1 illustrates a configuration of a sensor device according to a first embodiment.
Figure 6:
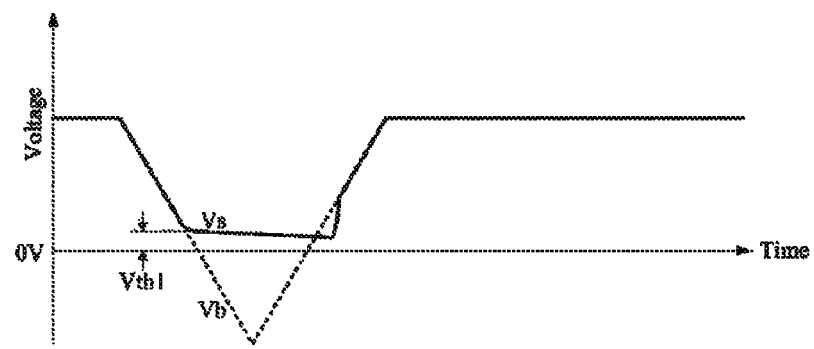
FIG. 6 illustrates an example of an internal power source voltage fluctuation waveform obtainable when a negative surge is applied, according to the technique of the present invention.
Figure 7:
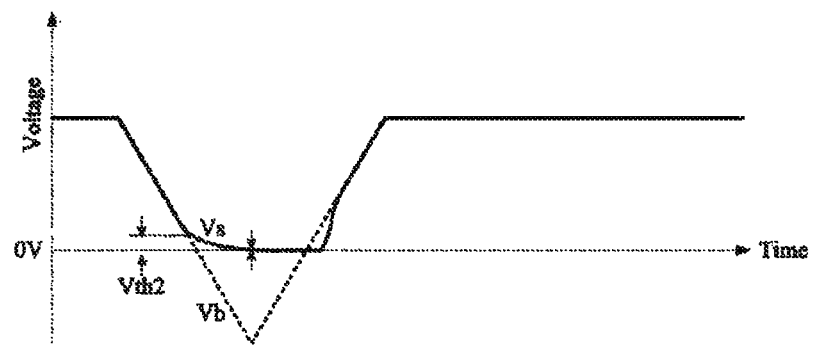
FIG. 7 illustrates an example of an internal power source voltage fluctuation waveform obtainable when a negative surge is applied, according to a conventional configuration.
Figure 8:
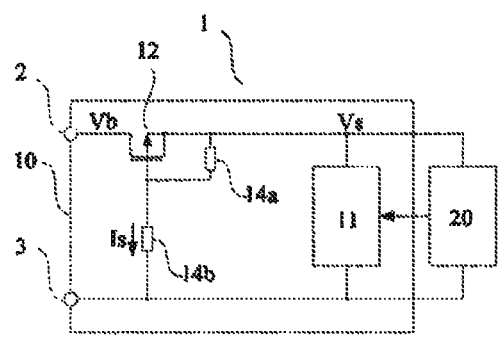
FIG. 8 illustrates a configuration of a conventional sensor device.

A sensor device according to a first embodiment of the present invention will be described with reference to FIGS. 1, 6, 7, and 8. FIG. 1 illustrates a configuration of the sensor device according to the first embodiment. FIG. 6 illustrates an example of an internal power source voltage fluctuation waveform obtainable when a negative surge is applied, according to the technique of the present invention. FIG. 7 illustrates an example of an internal power source voltage fluctuation waveform obtainable when a negative surge is applied, according to a conventional configuration. FIG. 8 illustrates a configuration of a conventional sensor device.

The configuration of the sensor device according to the first embodiment will be described with reference to FIG. 1.

A sensor device 1 according to the first embodiment includes a power source terminal 2 for supplying voltage Vb, a GND terminal 3, a sensor element 20 for generating an electric signal according to a physical amount, and a sensor circuit 10 for supplying power to the sensor element 20 and processing an output signal from the sensor element 20. The sensor circuit 10 includes a signal processing circuit 11 for processing an output signal from the sensor element 20, a P-type field-effect transistor (hereinafter, referred to as "PMOS") 12 interposed between the power source terminal 2 and the signal processing circuit 11, a resistor 14 for connecting a drain and a gate of the PMOS 12, and a PMOS 13 for connecting the gate of the PMOS 12 to a GND. A gate and a drain of the PMOS 13 are connected to the GND, and a source thereof is connected to the gate of the PMOS 12. The PMOS 13 has threshold voltage Vth1, and when source voltage of the PMOS 13 is larger than the threshold voltage Vth1, the PMOS 13 turns ON.

The function of the sensor device according to the first embodiment will be described with reference to FIGS. 1 and 7.

In normal times, the source voltage of the PMOS 13 is larger than the threshold voltage Vth1. Thus, the PMOS 13 turns ON, and current Is flows from the drain of the PMOS 12 to the GND via the PMOS 13. When a resistance value of the resistor 14 is sufficiently larger than ON resistance of the PMOS 13, the PMOS 12 enters an ON state, so that conduction is established between the power source terminal 2 and the signal processing circuit 11. Then, supply voltage Vs is supplied from the power source terminal 2 to the processing circuit 11. The sensor device 1 according to the first embodiment is configured to supply source voltage to the signal processing circuit 11 via the PMOS 12 in normal times, and can supply the stable supply voltage Vs to the processing circuit 11 irrespective of temperature because the PMOS 12 has a smaller voltage drop as compared with a parasitic diode.

On the other hand, if the supply voltage Vs abnormally drops due to a negative surge or the like, the PMOS 13 autonomously turns OFF at the time when the source voltage of the PMOS 13 reaches the threshold voltage Vth1. Upon the PMOS 13 turning OFF, the current Is that has been flowing in the PMOS 13 stops. Accordingly, the gate and the drain of the PMOS 12 have the same potential. Thus, even if the source voltage of the PMOS 12 fluctuates toward a negative side with respect to drain voltage of the PMOS 12, the PMOS 12 does not turn ON, and electrical charge accumulated in the signal processing circuit 11 is maintained. The PMOS 13 autonomously turns OFF at the time when the source voltage of the PMOS 13 reaches the threshold voltage Vth1. It is therefore possible to surely turn OFF the PMOS 12.

The PMOS 13 turns OFF at the time when the source voltage reaches the threshold voltage Vth1. The PMOS 13 thereby regulates the flow of the current Is. Thus, even if a negative surge or the like occurs and continues for a relatively long time, electrical charge accumulated in the processing circuit via the resistor 14 can be prevented from being fully discharged. The supply voltage Vs of the processing circuit 11 is maintained in the vicinity of threshold voltage Vth. Thus, by setting the threshold voltage Vth to a voltage value equal to or larger than stored information of a memory provided in the processing circuit 11, the malfunction of the sensor device can be prevented.

In addition, for preventing the operation delays of the PMOS 12 and the PMOS 13, it is desirable to connect a well of the PMOS 12 and a well of the PMOS 13 to a node on the supply voltage Vs side to stabilize voltage of each well. Thus, the well of the PMOS 12 is connected to the drain, and the well of the PMOS 13 is connected to the source.

Figure 9:
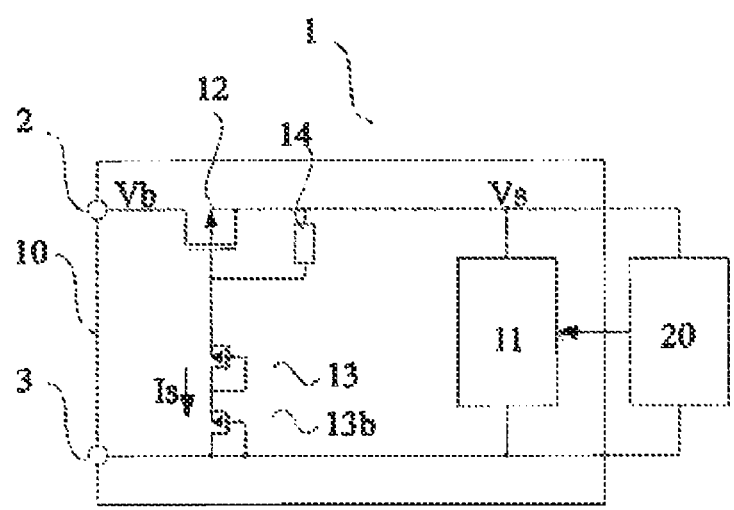
FIG. 9 illustrates an application example of the sensor device according to the fifth embodiment.

In contrast, the function of the sensor device according the conventional configuration will be described with reference to FIGS. 8 and 9. According to the conventional configuration, if the source voltage Vb falls below threshold voltage Vth2 of the PMOS 12, the PMOS 12 turns OFF. At this time, the supply voltage Vs drops to about the threshold voltage Vth2. Then, electrical charge accumulated in the signal processing circuit 11 continues to be discharged via resistors 14a and 14b. Finally, all the electrical charge is lost. Thus, the supply voltage Vs fails to be maintained, so that the malfunction of the sensor device may be caused.

The effects of the sensor device according to the first embodiment will be summarized.

The first effect lies in that the sensor device is configured to supply source voltage to the signal processing circuit 11 via the PMOS 12 in normal times, and can supply the stable supply voltage Vs to the processing circuit 11 irrespective of temperature because the PMOS 12 has a smaller voltage drop as compared with a parasitic diode.

The second effect lies in that the malfunction of the sensor can be prevented because the drop in the supply voltage Vs to the signal processing circuit 11 can be maintained in the vicinity of the threshold voltage Vth1 of the PMOS 13 even if a negative surge or a source voltage drop that continues for a long time occurs.

The third effect lies in that the PMOS 12 can be surely turned OFF because the PMOS 13 autonomously turns OFF at the time when the source voltage of the PMOS 13 falls below the threshold voltage Vth1.

Figure 2:
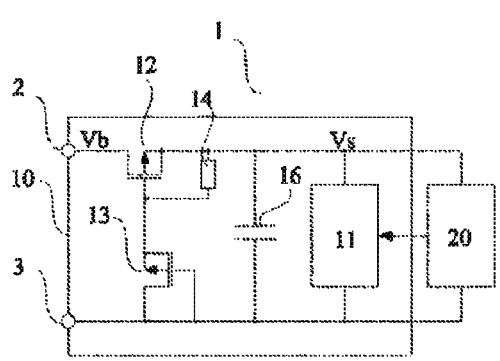
FIG. 2 illustrates a configuration of a sensor device according to a second embodiment.

A sensor device according to a second embodiment of the present invention will be described with reference to FIG. 2. FIG. 2 illustrates a configuration of the sensor device according to the second embodiment. In addition, the description of the points overlapped with the first embodiment of the present invention will be omitted.

A sensor device 1 according to the second embodiment is characterized in that a capacitor 16 is connected in series to the signal processing circuit 11 in the sensor device 1 according to the first embodiment. A low-pass filter including ON resistance of the PMOS 12 and the capacitor 16 is thereby formed. This can make it difficult to transmit a fluctuation in the source voltage Vb to the supply voltage Vs. In addition, the amount of electrical charge that can be accumulated is increased by the capacitor 16. It is therefore possible to suppress the drop amount of the supply voltage Vs with respect to a discharge amount. Thus, the second embodiment of the present invention can further improve negative surge resistance.

Figure 3:
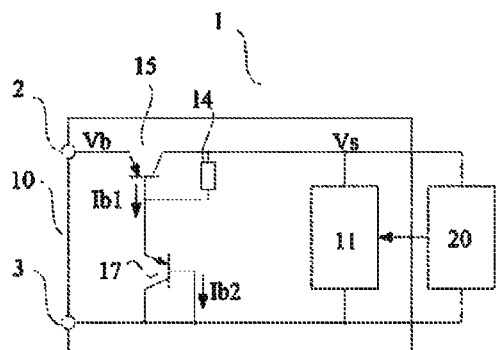
FIG. 3 illustrates a configuration of a sensor device according to a third embodiment.

A sensor device according to a third embodiment of the present invention will be described with reference to FIG. 3. FIG. 3 illustrates a configuration of the sensor device according to the third embodiment. In addition, the description of the points overlapped with the first embodiment of the present invention will be omitted.

A sensor device 1 according to the third embodiment includes a PNP bipolar transistor (hereinafter, referred to as "PNP transistor") 15 and a PNP transistor 17, instead of the PMOS 12 and the PMOS 13 in the sensor device 1 according to the first embodiment. An emitter of the PNP transistor 15 and a power source terminal 2 are connected, a collector of the PNP transistor 15 and a signal processing circuit 11 are connected, and a base of the PNP transistor 15 and an emitter of the PNP transistor 17 are connected. A collector and a base of the PNP transistor 17 are connected to the GND. In normal times, base currents Ib1 and Ib2 flow in the PNP transistors 15 and 17. The PNP transistors 15 and 17 accordingly enter the ON state. If the supply voltage Vs falls below threshold voltage Vth of the PNP transistor 17, the PNP transistor 17 enters an OFF state. At the same time, base voltage and collector voltage of the PNP transistor 15 have the same potential. Thus, even if emitter voltage of the PNP transistor 15 fluctuates toward a negative side with respect to collector voltage, the PNP transistor 15 does not turn ON, and electrical charge accumulated in the signal processing circuit 11 is maintained. The supply voltage Vs can be accordingly maintained in the vicinity of the threshold voltage Vth of the PNP transistor 17. The sensor device according to the present embodiment can obtain the effects similar to those of the sensor device according to the first embodiment. Furthermore, since bipolar transistors can flow larger current than that in MOSFETs, bipolar transistors are suitable for a sensor device with large power consumption.

Figure 4:
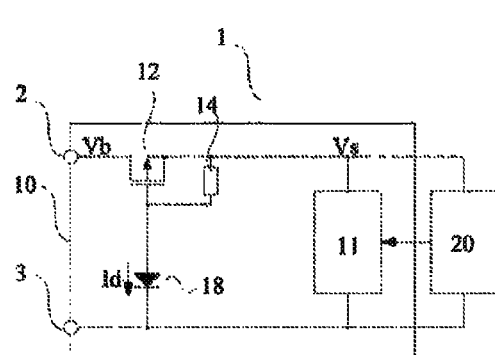
FIG. 4 illustrates a configuration of a sensor device according to a fourth embodiment.

A sensor device according to a fourth embodiment of the present invention will be described with reference to FIG. 4. FIG. 4 illustrates a configuration of the sensor device according to the fourth embodiment. In addition, the description of the points overlapped with the first embodiment of the present invention will be omitted.

A sensor device 1 according to the fourth embodiment includes a PN junction diode 18 instead of the PMOS 13 in the sensor device 1 according to the first embodiment. A connection point between a resistor 14 and a gate of a PMOS 12 is connected to an anode of the PN junction diode 18, and a cathode of the PN junction diode 18 is connected to the GND. In normal times, forward current Id flows in the PN junction diode 18. The PMOS 12 accordingly turns ON. If supply voltage Vs falls below forward voltage Vd of the PN junction diode 18, the forward current Id is regulated by the PN junction diode 18, so that a gate and a drain of the PMOS 12 have the same potential. Thus, even if the source voltage of the PMOS 12 fluctuates toward a negative side with respect to drain voltage, the PMOS 12 does not turn ON, and electrical charge accumulated in the signal processing circuit 11 is maintained. The supply voltage Vs can be accordingly maintained in the vicinity of the forward voltage Vd of the PN junction diode 18. The sensor device according to the present embodiment can obtain the effects similar to those of the sensor device according to the first embodiment.

Figure 5:
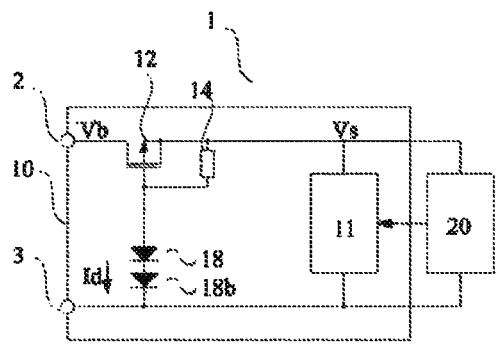
FIG. 5 illustrates a configuration of a sensor device according to a fifth embodiment.

A sensor device according to a fifth embodiment of the present invention will be described with reference to FIG. 5. FIG. 5 illustrates a configuration of the sensor device according to the fifth embodiment. In addition, the description of the points overlapped with the first embodiment of the present invention will be omitted.

A sensor device 1 according to the fifth embodiment includes a PN junction diode 18b connected in series to the PN junction diode 18 in the sensor device 1 according to the fourth embodiment. With this configuration, if supply voltage Vs drops to fall below a doubled value of forward voltage Vd of the PN junction diodes 18 and 18b, forward current Id is regulated, so that a gate and a drain of the PMOS 12 have the same potential. Thus, even if the source voltage of the PMOS 12 fluctuates toward a negative side with respect to drain voltage, the PMOS 12 does not turn ON, and electrical charge accumulated in the signal processing circuit 11 is maintained. The supply voltage Vs can be accordingly maintained in the vicinity of the doubled value of the forward voltage Vd of the PN junction diodes 18 and 18b. The sensor device according to the present embodiment can obtain the following effect in addition to the effects of the sensor device according to the first embodiment. More specifically, the effect lies in that hold voltage of the supply voltage Vs can be adjusted according to the number of series-connected PN junction diodes.

Figure 10:
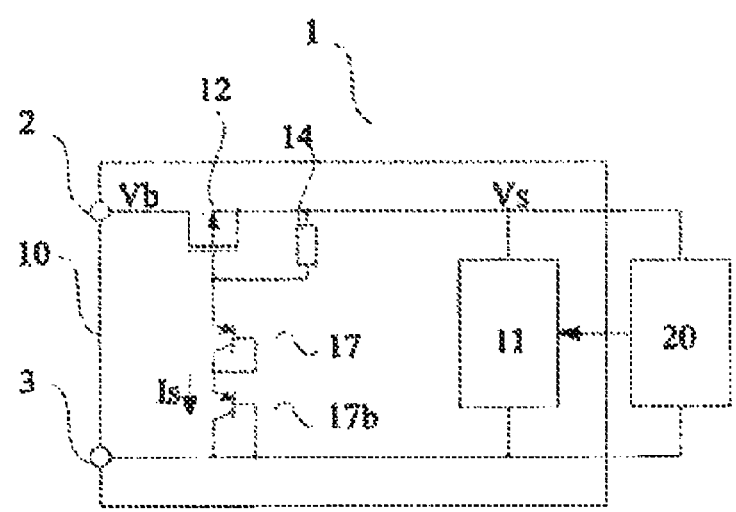
FIG. 10 illustrates an application example of the sensor device according to the fifth embodiment.

In addition, the above-described technique of adjusting hold voltage can be realized by using a P-type field-effect transistor or a PNP bipolar transistor. For example, as illustrated in FIG. 9, there is a method of further adding a PMOS 13b between the GND and the drain of the PMOS 13 of the sensor device 1 according to the first embodiment, connecting the gate and the drain of the PMOS 13 to a source of the PMOS 13b, and connecting a gate and a drain of the PMOS 13b to the GND. In addition, as illustrated in FIG. 10, there is a method of further adding a PNP transistor 17b between the GND and the collector of the PNP transistor 17 of the sensor device 1 according to the third embodiment, connecting the base and the collector of the PNP transistor 17 to an emitter of the PNP transistor 17b, and connecting a base and a collector of the PNP transistor 17b to the GND. Also in the case of using each of the above-described configurations, hold voltage of the supply voltage Vs can be adjusted.

REFERENCE SIGNS LIST

1: sensor device, 2: power source terminal, 3: GND terminal, 10: sensor circuit, 11: signal processing circuit, 12: MOSFET, 13: MOSFET, 14: resistor, 15: transistor, 16: capacitor, 17: transistor, 18: diode, 19: diode, 20: sensor element

The invention claimed is:

1. A sensor device comprising:
a sensor element having an electrical characteristic varying according to a physical amount;
a signal processing circuit configured to process an output signal of the sensor element;
a transistor element interposed between a power source terminal and the signal processing circuit;
a resistive element configured to connect a gate of the transistor element or a base of the transistor element to a wire connecting the transistor element and the signal processing circuit; and
an element having threshold voltage for connecting the gate or the base of the transistor element to a GND,
wherein the element maintains electrical charge accumulated in the signal processing circuit by limiting current flowing from the resistive element in a direction of the GND and switching the transistor element off, in a case in which supply voltage to the signal processing circuit falls below the threshold voltage.

2. The sensor device according to claim 1,
wherein the transistor element is a first field-effect transistor, and
wherein a source of the first field-effect transistor and the power source terminal are connected, a drain of the first field-effect transistor and the signal processing circuit are connected, and a gate of the first field-effect transistor is connected to the GND via the element.

3. A sensor device comprising:
a sensor element having an electrical characteristic varying according to a physical amount;
a signal processing circuit configured to process an output signal of the sensor element;
a transistor element interposed between a power source terminal and the signal processing circuit;
a resistive element configured to connect a gate of the transistor element, or a collector and a base of the transistor element; and
an element having threshold voltage for connecting the gate or the base of the transistor element to a GND,
wherein the element regulates current flowing from the resistive element in a direction of the GND, in a case in which supply voltage to the signal processing circuit falls below the threshold voltage, wherein the transistor element is a first field-effect transistor, wherein a source of the first field-effect transistor and the power source terminal are connected, a drain of the first field-effect transistor and the signal processing circuit are connected, and a gate of the first field-effect transistor is connected to the GND via the element, wherein the element is a second field-effect transistor, and wherein a source of the second field-effect transistor and the gate of the first field-effect transistor are connected, and a drain and a gate of the second field-effect transistor and the GND are connected.

4. The sensor device according to claim 3, wherein a well of the first field-effect transistor is connected to a drain of the first field-effect transistor, and a well of the second field-effect transistor is connected to the source of the second field-effect transistor.

5. The sensor device according to claim 2, wherein the element is a transistor circuit including a plurality of series-connected field-effect transistors, and wherein a source of the transistor circuit and the gate of the first transistor are connected, and a drain and a gate of the transistor circuit and the GND are connected.

6. The sensor device according to claim 2, wherein the element is a PN junction diode, and wherein an anode of the diode and the gate of the first field-effect transistor are connected, and a cathode of the diode and the GND are connected.

7. The sensor device according to claim 2, wherein the element is a diode circuit including a plurality of series-connected PN junction diodes, and wherein an anode of the diode circuit and the gate of the first field-effect transistor are connected, and a cathode of the diode circuit and the GND are connected.

8. The sensor device according to claim 1, wherein the transistor element is a first PNP transistor, and wherein an emitter of the first PNP transistor and the power source terminal are connected, a collector of the first PNP transistor and the signal processing circuit are connected, and a base of the first PNP transistor is connected to the GND via the element.

9. A sensor device comprising:

a sensor element having an electrical characteristic varying according to a physical amount;

a signal processing circuit configured to process an output signal of the sensor element;

a transistor element interposed between a power source terminal and the signal processing circuit;

a resistive element configured to connect a drain and a gate of the transistor element, or a collector and a base of the transistor element; and an element having threshold voltage for connecting the gate or the base of the transistor element to a GND, wherein the element regulates current flowing from the resistive element in a direction of the GND, in a case in which supply voltage to the signal processing circuit falls below the threshold voltage, wherein the transistor element is a first PNP transistor, wherein an emitter of the first PNP transistor and the power source terminal are connected, a collector of the first PNP transistor and the signal processing circuit are connected, and a base of the first PNP transistor is connected to the GND via the element, wherein the element is a second PNP transistor, and wherein an emitter of the second PNP transistor and the base of the first PNP transistor are connected, and a collector and a base of the second PNP transistor are connected to the GND.

10. The sensor device according to claim 8, wherein the element is a transistor circuit including a plurality of series-connected PNP transistors, and wherein an emitter of the transistor circuit and the base of the first PNP transistor are connected, and a collector and a base of the transistor circuit and the GND are connected.

11. The sensor device according to claim 8, wherein the element is a PN junction diode, and wherein an anode of the diode and the base of the first PNP transistor are connected, and a cathode of the diode and the GND are connected.

12. The sensor device according to claim 8, wherein the element is a diode circuit including a plurality of series-connected PN junction diodes, and wherein an anode of the diode circuit and the base of the first PNP transistor are connected, and a cathode of the diode circuit and the GND are connected.

13. The sensor device according to claim 1, wherein the sensor device includes a capacitor series-connected to the signal processing circuit.

14. The sensor device according to claim 1, wherein threshold voltage of the element is a voltage value equal to or larger than information stored in a memory of the processing circuit.

* * * * *